United States Patent
Shajaan et al.

(10) Patent No.: US 11,743,647 B2
(45) Date of Patent: Aug. 29, 2023

(54) MULTI-RATE INTEGRATED CIRCUIT CONNECTABLE TO A SENSOR

(71) Applicant: Knowles Electronics, LLC, Itasca, IL (US)

(72) Inventors: Mohammad Shajaan, Copenhagen (DK); Kristian Hansen, Roedovre (DK); Jens Tingleff, Copenhagen (DK); Henrik Thomsen, Copenhagen (DK); Claus Fürst, Roskilde (DK)

(73) Assignee: KNOWLES ELECTRONICS, LLC., Itasca, IL (US)

( * ) Notice: Subject to any disclaimer, the term of this patent is extended or adjusted under 35 U.S.C. 154(b) by 244 days.

(21) Appl. No.: 17/312,793

(22) PCT Filed: Dec. 10, 2019

(86) PCT No.: PCT/US2019/065538
§ 371 (c)(1),
(2) Date: Jun. 10, 2021

(87) PCT Pub. No.: WO2020/123550
PCT Pub. Date: Jun. 18, 2020

(65) Prior Publication Data
US 2022/0141586 A1 May 5, 2022

Related U.S. Application Data

(60) Provisional application No. 62/778,180, filed on Dec. 11, 2018.

(51) Int. Cl.
H04R 3/06 (2006.01)

(52) U.S. Cl.
CPC ........ *H04R 3/06* (2013.01); *B81B 2201/0257* (2013.01); *H04R 2201/003* (2013.01); *H04R 2410/03* (2013.01)

(58) Field of Classification Search
CPC .......................... H04R 3/06; H04R 2201/003; H04R 2410/03; B81B 2201/0257
(Continued)

(56) References Cited

U.S. PATENT DOCUMENTS

| | | | |
|---|---|---|---|
| 5,493,297 A | * | 2/1996 | Nguyen ................ H03M 3/368 341/118 |
| 7,190,038 B2 | | 3/2007 | Dehe et al. |

(Continued)

FOREIGN PATENT DOCUMENTS

EP 1 777 825 B1 4/2007

OTHER PUBLICATIONS

International Search Report and Written Opinion for International Application No. PCT PCT/US2019/065538 dated Jul. 7, 2020, 11 pages.

*Primary Examiner* — Sean H Nguyen
(74) *Attorney, Agent, or Firm* — Foley & Lardner LLP

(57) ABSTRACT

An integrated circuit connectable to a sensor includes a transconductance element and a current-input analog-to-digital converter (I-ADC). The transconductance element is connectable to the sensor and is configured to generate a current signal representative of an output of the sensor. The I-ADC is configured to sample and quantize the current signal to generate a corresponding digital sensor signal. The I-ADC includes a continuous-time (CT) integrator stage, a discrete-time (DT) integrator stage, and a feedback digital-to-analog converter (FB-DAC). The CT integrator stage is configured to receive the current output and the I-ADC is configured to generate the digital sensor signal based on an output of the CT integrator stage and an output of the DT integrator stage. The FB-DAC is configured to provide a feedback signal based on the digital sensor signal for adding to the current signal.

22 Claims, 7 Drawing Sheets

(58) Field of Classification Search
USPC .................................................. 381/94.1
See application file for complete search history.

(56) References Cited

U.S. PATENT DOCUMENTS

| | | | |
|---|---|---|---|
| 7,473,572 B2 | 1/2009 | Dehe et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,840,015 B1 * | 11/2010 | Melanson | H03F 3/2175 330/10 |
| 7,856,804 B2 | 12/2010 | Laming et al. | |
| 7,903,831 B2 | 3/2011 | Song | |
| 2005/0207605 A1 | 9/2005 | Dehe et al. | |
| 2007/0210948 A1 | 9/2007 | Wang | |
| 2007/0278501 A1 | 12/2007 | Macpherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2012/0001659 A1 | 1/2012 | Balmelli | |
| 2014/0233773 A1 * | 8/2014 | Nestler | G10K 15/00 341/172 |
| 2014/0270261 A1 * | 9/2014 | Wiesbauer | H03M 1/60 341/110 |
| 2016/0242645 A1 | 8/2016 | Muller | |
| 2017/0328712 A1 * | 11/2017 | Collin | G01C 19/5726 |
| 2017/0374469 A1 | 12/2017 | Pal et al. | |
| 2020/0366312 A1 * | 11/2020 | Li | H03M 3/378 |

* cited by examiner

MULTI-RATE INTEGRATED CIRCUIT CONNECTABLE TO A SENSOR

CROSS-REFERENCE TO RELATED APPLICATION

This application is a National Stage Application of PCT/US2019/065538, filed Dec. 10, 2019, which claims the benefit of and priority to U.S. Provisional Patent Application No. 62/778,180, filed Dec. 11, 2018, the entire disclosure of which is incorporated by reference herein.

BACKGROUND

Certain sensor devices such as acoustic sensors (e.g. microphone assemblies), accelerometers, humidity sensors, etc. are compact devices which usually are powered from rechargeable battery sources. The compact dimensions and battery source put constraints on the maximum acceptable dimensions and/or power consumption of sensors and sensor circuits utilized in such sensor devices.

Many such devices include various noise reducing measures at least to some certain extents.

However, there exists a continued need to further reduce noise and thereby improve the sensor quality and robustness of sensor assemblies; especially without compromising power consumption.

SUMMARY

A first aspect relates to an integrated circuit connectable to an output of a sensor in a sensor assembly (e.g., a capacitive sensor assembly or alternatively a resistive sensor assembly). The circuit comprises a transconductance element having a voltage input, connectable to the sensor output, and a current output. The transconductance element is configured to generate a current signal representative of a sensor signal on the basis of the voltage input. The circuit further comprises a current-input analog-to-digital converter (I-ADC) including an input node coupled to the current output of the transconductance element where the I-ADC is configured to sample and quantize the current signal to generate a corresponding digital sensor signal. The I-ADC comprises a continuous-time (CT) integrator stage and a discrete-time (DT) integrator stage. The continuous-time (CT) integrator stage is configured to receive the current output of the transconductance element and the I-ADC is configured to generate the digital sensor signal based on output signal(s) of the continuous-time (CT) integrator stage and the discrete-time (DT) integrator stage or a combination thereof. In some embodiments, the I-ADC further comprises a quantizer (Q) configured to generate the digital sensor signal. The I-ADC further comprises a feedback digital-to-analog converter (FB-DAC) connecting an output of the I-ADC to a second input node of the I-ADC. The FB-DAC is configured to provide a feedback signal based on the digital sensor signal, and the I-ADC is configured to add the feedback signal to the current signal at the second input node and to supply a result thereof as an input signal to the continuous-time (CT) integrator stage.

A second aspect relates to a microphone assembly comprising a housing including a base, a cover, and a sound port. The microphone assembly further includes a transducer element, e.g. a MEMS transducer element, disposed in the housing, the transducer element configured to convert sound into a microphone signal voltage at a transducer output. The microphone assembly further includes an integrated circuit according to the first aspect wherein the sensor signal is the microphone sensor voltage and the corresponding digital sensor signal is a corresponding digital microphone signal.

A third aspect relates to a communication device comprising a microphone assembly according to the second aspect.

A fourth aspect relates to a semiconductor die comprising an integrated circuit according to the first aspect.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

Figure 1:
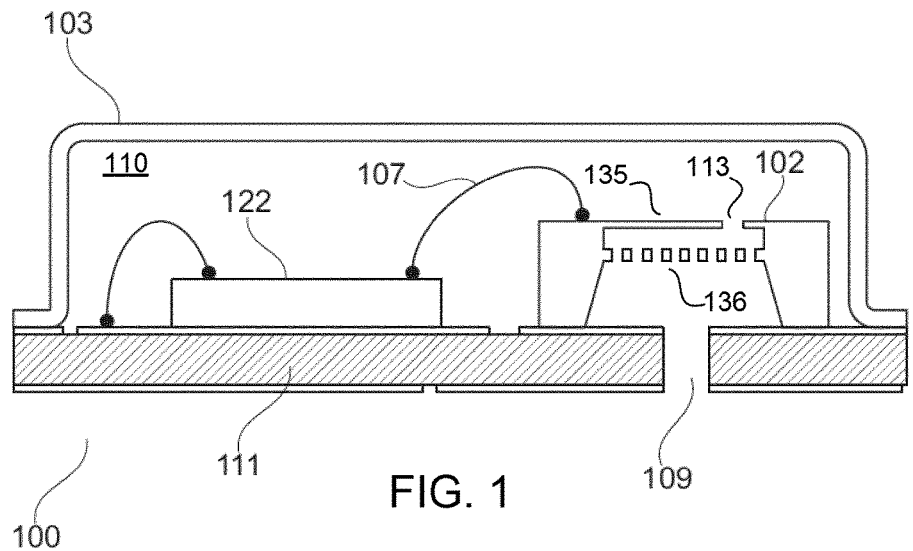
FIG. 1 is a schematic illustration of a sensor assembly in the form, as an example, of a miniature microphone assembly comprising an integrated circuit according to various embodiments.

In the following detailed description, various embodiments are described with reference to the appended drawings. The skilled person will understand that the accompanying drawings are schematic and simplified for clarity and therefore merely show details which are essential to the understanding of the present disclosure, while other details have been left out. Like reference numerals refer to like elements or components throughout. Like elements or components will therefore not necessarily be described in detail with respect to each figure. It will further be appreciated that certain actions and/or steps may be described or depicted in a particular order of occurrence while those skilled in the art will understand that such specificity with respect to sequence is not actually required.

DETAILED DESCRIPTION

A first aspect of the present disclosure relates to an integrated circuit connectable to an output of a sensor in a sensor assembly (e.g. a capacitive sensor assembly or a resistive sensor assembly). The circuit comprises a transconductance element having a voltage input, connectable to the sensor output, and a current output and being configured to generate a current signal representative of a sensor signal on the basis of the voltage input, e.g. in accordance with a predetermined transconductance (gm) of the transconductance element. An input impedance of the transconductance element is, at least in some embodiments, larger than 100 MΩ, such as larger than 1 GΩ. The circuit further comprises a current-input analog-to-digital converter (I-ADC) including an input node coupled to the current output of the transconductance element where the I-ADC is configured to sample and quantize the current signal to generate a corresponding digital sensor signal. The I-ADC comprises a continuous-time (CT) integrator stage and a discrete-time (DT) integrator stage. The continuous-time (CT) integrator stage is configured to receive the current output of the transconductance element and the I-ADC configured to generate the digital sensor signal based on an output signal of the continuous-time (CT) integrator stage and the discrete-time (DT) integrator stage. The I-ADC may e.g. further comprise a quantizer (Q) configured to generate the digital sensor signal based on the output of the continuous-time (CT) integrator stage and the discrete-time (DT) integrator stage. In some embodiments, the I-ADC may e.g. further comprise a feedback path where the feedback path connects an output of the quantizer (Q) to a second input node of the I-ADC. The I-ADC further comprises a feedback digital-to-analog converter (FB-DAC) connecting an output of the I-ADC to the second input node of the I-ADC. The FB-DAC may e.g. be located in the feedback path of the I-ADC (for embodiments comprising such). The I-ADC is configured to provide the digital sensor signal to the FB-DAC and as an output of the I-ADC. The FB-DAC is configured to provide a feedback signal in response to the provided digital sensor signal and the I-ADC is configured to add the feedback signal to the current signal at the second input node and to supply a result thereof as an input signal to the first integrator stage. In some embodiments, the quantizer (Q) is a mid-tread type quantizer (Q). The continuous-time (CT) integrator stage and the discrete-time (DT) integrator stage comprise, at least in some embodiments, a cascade of integrators with feed-forward summation (CIFF).

The continuous-time (CT) integrator stage provides an 'anti-aliasing' effect in the sense that high-frequency noise above the clock frequency of the I-ADC is attenuated thereby reducing the input (to the I-ADC) noise. In effect, the anti-aliasing effect will be corresponding to a low pass filter of order M, where M is the number of continuous-time (CT) integrator stages. For at least some certain traditional high-frequency applications in the present context, the integrator stages are normally implemented only as discrete-time (DT) integrator stages. Such implementations require a dedicated anti-aliasing filter, adding complexity, costs, and implementation size of the I-ADC, which is avoided according to the first aspect. Additionally, it becomes simpler to implement an 'aggressive' (i.e. substantial out of band gain) noise transfer function (NTF) since losses may be introduced fairly simply in the discrete-time (DT) integrator stage(s) to keep it/them stable with respect to potential overload.

The total input referred noise of an integrated circuit as disclosed herein is reduced significantly when using a transconductance element in combination with the multi-rate current-input analog-to-digital converter (I-ADC) as disclosed herein. It is possible achieve a signal transfer function (STF) of approximately 1 (i.e. very close to 1) (e.g. depending on how input and output is defined) and a noise transfer function (NTF) being much smaller than 1 (i.e. <<1) and virtually approximately about 0 (i.e. very close to 0), respectively, of an integrated circuit connectable to an output of a sensor in a sensor assembly according to the embodiment(s) disclosed herein.

In some embodiments, the I-ADC comprises an analog-to-digital converter (ADC) configured to quantize the output signal of the continuous-time (CT) integrator stage and the discrete-time (DT) integrator stage to provide the digital sensor signal and the I-ADC is a multi-rate I-ADC configured to operate at a predetermined first clock frequency (i.e. overall clock). Additionally, the ADC is a successive approximation analog-to-digital converter (SA ADC) configured to operate at a predetermined second clock frequency being an integer multiple (e.g. e.g. six or eight or generally depending on implementation) of the predetermined first clock frequency. The FB-DAC is configured to operate at the predetermined second clock frequency. The I-ADC is configured to introduce a delay in the circuitry of the I-ADC. The delay may e.g. be introduced in the quantizer (Q) (if present) and/or in the feedback loop signal path of the I-ADC, i.e. in the quantizer and (if present) in a dynamic element matching element or circuit (DELM) and/or a pulse correction element or circuit (FB DAC pulse setup). This significantly reduces power consumption, cost, and implementation size. As an illustration a particular implementation of a SA ADC may e.g. use about 3 mA while a corresponding flash ADC implementation will use between 50 to 100 mA.

In some embodiments, the SA ADC comprises a single comparator, a first and a second finite state machine (FSM S-A, FSM DAC), and a DAC.

In some embodiments, the multi-rate I-ADC further comprises a feedback path where the feedback path connects an output of the I-ADC (or the quantizer (Q) if present) to the second input node of the I-ADC. The multi-rate I-ADC further comprises a delay compensation DAC configured to operate at the predetermined first clock frequency and being connected to the feedback path, to receive the corresponding digital sensor signal, and to a fourth input node configured to add, or combine, an output of the delay compensation DAC to, or with, the output signals of the continuous-time (CT) integrator stage and the discrete-time (DT) integrator stage or a combination thereof, wherein the output of the delay compensation DAC is configured to compensate a noise transfer function of the multi-rate current-input analog-to-digital converter (I-ADC) for the introduced delay in the I-ADC/quantizer (Q) and/or the feedback loop. The delay compensation DAC provides converted values (i.e. the output of the quantizer Q/SA ADC) as analog values (potentially scaled) for adding in the next cycles input.

In some embodiments, a DAC of the SA ADC and the delay compensation DAC is the same whereby it is shared. This possible since the SA ADC and the delay compensation DAC does not—at least in some embodiments—need to be used at the same time due to running the DAC overclocked. Accordingly, a DAC is saved thereby saving power usage and implementation size (where a DAC typically is one of the largest and most expensive components in integrated circuits within the present context).

In some embodiments, the FB-DAC is an N-th level current steering feedback digital-to-analog converter, where N is a number corresponding to a number of levels of the I-ADC (or the quantizer (Q)).

In some embodiments, the circuit further comprises a pulse correction element or circuit being configured to receive a clock control signal and being configured to provide an output signal having a fixed pulse width generated in response to the clock control signal.

In some further embodiments, the pulse correction element or circuit comprises a first capacitor (Cfix) and at least one switched capacitor (C0, . . . C4), a finite state machine (FSM), a comparator, and a further switch operable by the clock control signal, wherein the pulse correction element or circuit is configured to, in response to the further switch changing state, charge the first capacitor (Cfix) and at least one switched capacitor (C0, . . . C4), under control of the finite state machine (FSM), until a resulting voltage of the first capacitor (Cfix) and at least one switched capacitor (C0, . . . C4) reaches a reference voltage, as determined by the comparator, giving a predetermined end point in time and supplying the output signal having a fixed pulse width where a start of the fixed pulse width is given by the further switch changing state and an end of fixed pulse width is given by the resulting voltage of the first capacitor (Cfix) and at least one switched capacitor (C0, . . . C4) reaching the reference voltage.

In some embodiments, the feedback loop may further comprises a dynamic element matching element or circuit (DELM) configured to switch or rotate between used or activated components of the current steering FB-DAC. A part of the introduced delay of the feedback path of the I-ADC may be used to calculate DELM settings. This saves power area compared to traditional low latency DELM circuits.

In some embodiments, the feedback digital-to-analog converter (FB-DAC) and the dynamic element matching element or circuit (DELM) are configured to operate at a predetermined third clock frequency being an integer multiple, e.g. 2×, 3×, etc., of the predetermined first clock frequency.

In some embodiments, the circuit further comprises a feed-forward path configured to operate in continuous time (CT) being connected to the first input node (i.e. the output of the transconductance element) to receive the current signal and being connected to a fourth input node configured to add, or combine, an signal of the feed-forward path to, or with, the output signals of the first and the second integrator stage or a combination thereof.

In some embodiments, the first integrator stage comprises a single-stage operational transconductance amplifier (OTA).

In some embodiments, an effective input impedance, at 1 kHz, of the current-input analog-to-digital converter (I-ADC) is smaller than 1 kΩ.

In some embodiments, a load resistance of the transconductance element or an equivalent impedance ($R_P$), at 1 kHz, of the transconductance element is larger than 1 MΩ, preferably larger than 10 MΩ such as larger than 50 MΩ.

In some embodiments, the predetermined transconductance (gm) is larger than $$\frac{1}{400 \text{ kohm}},$$

preferably larger than $$\frac{1}{5 \text{ kohm}}.$$

In some embodiments, a product of the predetermined transconductance (gm) and a load resistance of the transconductance element or an equivalent impedance ($R_P$) is larger than 5, preferably larger than 10, more preferably larger than 20, more preferably larger than 50, more preferably larger than 200, or larger than 1000.

In some embodiments, the sensor output is provided by a transducer element comprising a capacitive transducer supplying the sensor signal as a sensor signal voltage across first and second mutually charged transducer electrodes. The transducer element may, at least in some embodiments, exhibit a transducer capacitance between 0.5 pF and 10 pF.

Further aspects of the present disclosure relate to a microphone assembly comprising a housing including a base, a cover, and a sound port. The microphone assembly further includes a transducer element, e.g. a MEMS transducer element, disposed in the housing, the transducer element configured to convert sound into a microphone signal voltage at a transducer output. The microphone assembly further includes an integrated circuit according to the first aspect and as disclosed herein wherein the sensor signal is the microphone sensor voltage and the corresponding digital sensor signal is a corresponding digital microphone signal.

The housing may further include a host device interface with electrical contacts. The microphone assembly may therefore include a housing enclosing and supporting the transducer element and the integrated circuit. A bottom portion or base of the microphone housing may include a carrier board, such as a printed circuit board, onto which the integrated circuit and the transducer element are attached or fixed by a suitable bonding mechanism. The microphone housing may include a sound port or inlet allowing sound passage to the transducer element as discussed in further detail below with reference to the appended drawings.

The transducer element converts incoming sound into a corresponding electrical microphone signal. The transducer may be a condenser, piezoelectric or other electroacoustic transducer implemented using microelectromechanical systems (MEMS) or another fabrication technology. A suitable capacitive MEMS transducer element may for example exhibit a transducer capacitance between 0.5 pF and 10 pF. Capacitive transducer elements may include first and second mutually charged transducer plates, e.g. a diaphragm and back plate, respectively, supplying the microphone signal. The charge may be injected onto one of the diaphragm and back plate by an appropriate high-impedance DC bias voltage supply. The integrated circuit may include a semiconductor die, for example a mixed-signal CMOS semiconductor device integrating the transconductance amplifier, the analog-to-digital converter, and optionally various other analog and digital circuits as disclosed herein. A frequency of sound to be converted by the transducer element is, at least in some embodiments, larger than 0.1 Hz and less than 200 kHz. In other embodiments, the frequency is larger than 0 Hz and less than about 200 kHz. In yet other embodiments, the frequency is about 20 Hz to about 200 kHz, for example from 20 Hz to 20 kHz. In still other embodiments, the frequency is less than 200 kHz.

The microphone assembly may be shaped and sized to fit into, e.g. portable, audio and communication devices such as smartphones, tablets and mobile phones, IoT devices, etc. The transducer element may be responsive to audible sound. An audio and communication device may also comprise a plurality of microphone assemblies as disclosed herein.

The analog-to-digital converter (I-ADC) output may be converted (e.g. using a digital-to-digital conversion block) to produce a multibit or single-bit digital microphone signal representative of the microphone signal depending on the particular converter type. The number of bits of the produced digital microphone signal representative of the microphone signal is or may be different from the resolution of the quantizer (Q) and/or the current output feedback digital-to-analog converter (FB-DAC). Some embodiments of the analog-to-digital converter (I-ADC) may include an oversampled converter type such as a single-bit or multibit sigma-delta converter (IA) configured to generate a single-bit (e.g. PDM) or multibit digital microphone signal at a first sampling frequency (being the same as the first clock frequency). The multibit sigma-delta converter (IA) may be configured to generate the multibit digital microphone signal with samples of two, three or four bits. The first sampling frequency may lie between 1 MHz and 20 MHz, such as between 2.048 MHz and 4.196 MHZ, for example 3.092 MHZ. The skilled person will understand that the transconductance amplifier may be integrated within the analog-to-digital converter in some embodiments. In some further embodiments, the microphone assembly further comprises an additional feedback path comprising: a digital loop filter being configured to receive and filter the digital microphone signal to provide a first digital feedback signal; an additional digital-to-analog converter (DAC) configured to convert the first digital feedback signal into a corresponding additional analog feedback signal; and a summing node at the transducer output configured to combine the microphone signal and the additional analog feedback signal, e.g. as disclosed in the Patentee's co-pending US Application Publication No. 2018/0014123, incorporated herein by reference in its entirety. In some further embodiments, the additional digital-to-analog converter (DAC) comprises: a hybrid Pulse-Width and Pulse-Amplitude Modulator (PWAM) configured to generate the additional analog feedback signal by: converting the first digital feedback signal into a corresponding pulse-width and pulse-amplitude modulated signal at a higher sampling frequency than a sampling frequency of the first digital feedback signal, e.g. as disclosed in the Patentee's co-pending US Application Publication No. 2018/0014123, incorporated herein by reference in its entirety.

The integrated circuit may include a digital processor implementing at least some of the functionality as disclosed herein and/or other control functions of the integrated circuit such as state switching of the digital-to-analog converter, controlling the operation of a command and control interface connectable to host processor of a, e.g. portable, communication device, e.g. a smartphone, etc. The digital processor may comprise a digital state machine and/or a software programmable microprocessor such as a digital signal processor (DSP).

In some embodiments, the current-input analog-to-digital converter (I-ADC) is a multi-bit current-input sigma delta analog-to-digital converter (I-ADC) configured to output the corresponding digital sensor signal at a resolution being a predetermined number of bits where the predetermined number of bits is two or more bits or three or more bits, e.g. four bits.

Further aspects of the present disclosure relate to a, e.g. portable, communication device comprising the microphone assembly according to any of the above-described embodiments thereof and/or as disclosed herein. The communication device may include an application processor, e.g., a microprocessor such as a Digital Signal Processor. The application processor may include a data communication interface compliant with, and connected to, an externally accessible data communication interface of the microphone assembly. The data communication interface may include a proprietary interface or a standardized data interface, such as one of I²C, USB, UART, SoundWire or SPI compliant data communication interfaces. Various types of configuration data of the integrated circuit may be transmitted from the application processor to the microphone assembly, as discussed in further detail below with reference to the appended drawings.

Further aspects of the present disclosure relate to an integrated semiconductor die including an integrated circuit according to any of the above-described embodiments thereof and/or as disclosed herein. More particularly, the further aspects of the present disclosure relate to an integrated semiconductor die comprising an integrated circuit connectable to an output of a sensor in a sensor assembly (e.g. a capacitive sensor assembly). The circuit comprises a transconductance element having a voltage input, connectable to the sensor output, and a current output and being configured to generate a current signal representative of a sensor signal on the basis of the voltage input, and e.g. in accordance with a predetermined transconductance (gm) of the transconductance element. An input impedance of the transconductance element is, at least in some embodiments, larger than 100 MΩ, such as larger than 1 GΩ. The circuit further comprises a current-input analog-to-digital converter (I-ADC) including an input coupled to the current output of the transconductance element and configured to sample and quantize the current signal to generate a corresponding digital sensor signal. The I-ADC comprises a continuous-time (CT) integrator stage and a discrete-time (DT) integrator stage, the continuous-time (CT) integrator stage configured to receive the current output of the transconductance element and the I-ADC configured to generate the digital sensor signal based on an output signal of the continuous-time (CT) integrator stage and the discrete-time (DT) integrator stage. The I-ADC further comprises a feedback digital-to-analog converter (FB-DAC) connecting an output of the I-ADC to a second input of the I-ADC, the FB-DAC configured to provide a feedback signal based on the digital sensor signal, and the I-ADC is configured to add the feedback signal to the current signal at the second input node and to supply a result thereof as an input signal to the continuous-time (CT) integrator stage. The I-ADC may at least in some embodiments further comprise a quantizer (Q) configured to generate the digital sensor signal based on the output of the continuous-time (CT) integrator stage and a discrete-time (DT) integrator stage. In such embodiments, the I-ADC may comprise a feedback path where the feedback path connects an output of the quantizer (Q) to a second input node of the I-ADC. The I-ADC further comprises a feedback digital-to-analog converter (FB-DAC) connecting an output of the I-ADC to a second input of the I-ADC. The FB-DAC is configured to provide a feedback signal based on the digital sensor signal, and the I-ADC is configured to add the feedback signal to the current signal at the second input node and to supply a result thereof as an input signal to the continuous-time (CT) integrator stage. The integrated circuit may include a CMOS semiconductor die.

FIG. 1 shows an embodiment of a sensor assembly in the form, as an example, of a miniature microphone assembly 100 comprising an integrated circuit according to various embodiments. The exemplary microphone assembly 100 includes (or is connected with) a capacitive transducer element 102, e.g. a microelectromechanical system (MEMS) transducer, configured to convert incoming sound into a corresponding microphone signal. The transducer element 102 may, for example, exhibit a transducer capacitance between 0.5 pF and 10 pF. The capacitive transducer element may include first and second mutually charged transducer electrodes or plates, e.g. a diaphragm 135 and back plate 136, respectively, supplying the microphone signal. The charge may be injected onto one of the diaphragm 135 and the back plate 136 by an appropriate high-impedance DC bias voltage supply (not shown). The microphone assembly 100 additionally includes an integrated circuit 122 connectable to an output of a sensor in a sensor assembly, which may include a semiconductor die, for example a mixed-signal CMOS semiconductor device integrating the various analog and digital circuits disclosed herein. The integrated circuit 122 is e.g. shaped and sized for mounting on a substrate or carrier element 111 of the assembly 100, where the substrate or carrier element 111 likewise may support the capacitive transducer element 102. The microphone assembly 100 includes a housing lid 103 mounted onto a peripheral edge of the substrate or carrier element 111 such that the housing lid 103 and substrate or carrier element 111 jointly form a microphone housing enclosing and protecting the transducer element 102 and the integrated circuit 122 of the assembly 100. The microphone housing may include a sound inlet or sound port 109 projecting through the substrate or carrier element 111, or through the housing lid 103 in other embodiments, for conveying sound waves to the transducer element 102.

The transducer element 102 generates a microphone signal at a transducer output (see e.g. item 101a of FIG. 2) in response to impinging sound. The transducer output may for example include a pad or terminal of the transducer element 102 that is electrically coupled to the integrated circuit 122 via one or more bonding wires 107 electrically interconnecting respective signal pads of the transducer element 102 and integrated circuit 122.

Figure 2:
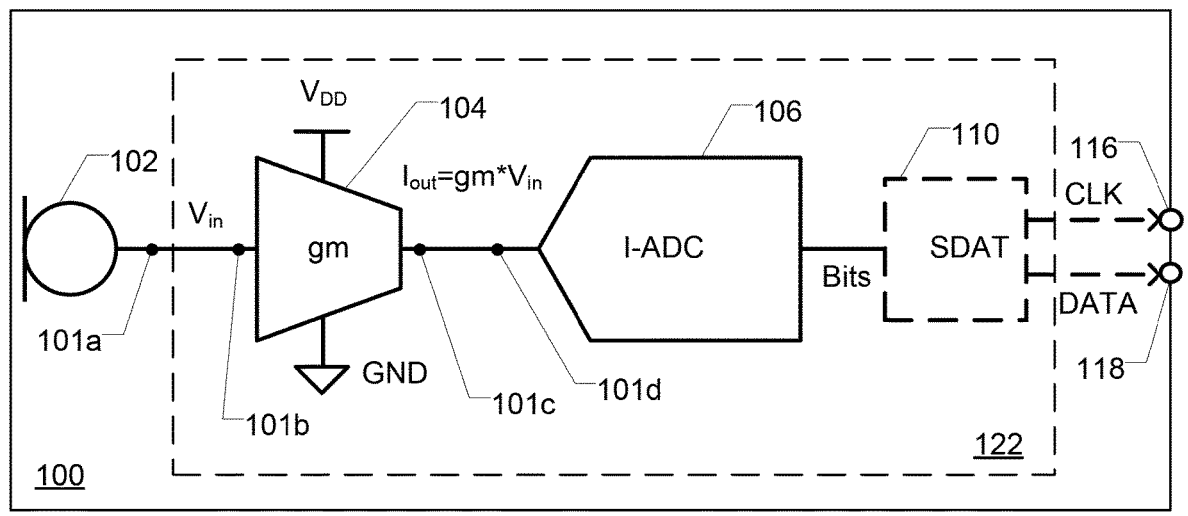
FIG. 2 illustrates a simplified electrical block diagram of a sensor assembly in the form, as an example, of a miniature microphone assembly comprising an integrated circuit according to various embodiments.

FIG. 2 illustrates a simplified electrical block diagram of a sensor assembly in the form, as an example, of a miniature microphone assembly 100, e.g. such as the one illustrated in FIG. 1, comprising an integrated circuit 122 according to various embodiments as disclosed herein. The integrated circuit 122 includes a current output transconductance element 104 having a voltage input and being connectable to a sensor output and having an input node or terminal 101b (also referred herein as the third input node) connected to a sensor output 101a (e.g. a transducer output) of a sensor 102 (e.g. a transducer element) for receipt of a sensor signal $V_{in}$, here as an example a microphone signal voltage produced by the transducer element 102. As output, the transconductance element 104 generates a current signal (denoted '$I_{out}$' in FIG. 2) representative of the sensor signal or microphone signal voltage in accordance with a predetermined transconductance (denoted 'gm' in FIG. 2) of the transconductance element 104. The output of the transconductance element 104 is supplied to a multi-rate current-input analog-to-digital converter (I-ADC) 106, via respective input 101d and output 101c nodes, where the multi-rate current-input analog-to-digital converter I-ADC 106 is configured to receive current from a high impedance source and for sampling and quantization of the current signal to generate a multibit digital sensor signal (denoted 'Bits' on FIG. 2) representative of the sensor signal.

The current-input analog-to-digital converter (I-ADC) 106 is an $N^{th}$ level analog-to-digital converter, i.e. operates using N levels (as represented by a number of bits. N may e.g. be represented by one bit, at least two bits, at least three bits, at least four bits, or selected from the range from about two or three bits to about eight to ten bits. The input node 101d is also designated as a first input node herein. The multi-rate current input analog-to-digital converter (I-ADC) 106 comprises a current sensitive first integrator stage for receipt of the current signal (e.g. in some embodiments as a combination with one or more other signals as disclosed herein) and a least a second integrator stage (e.g. a current sensitive second integrator stage). In some embodiments, the multi-rate current input analog-to-digital converter (I-ADC) 106 comprises two or three integrator stages and in other embodiments the multi-rate current input analog-to-digital converter (I-ADC) 106 comprises more than three integrator stages, e.g. up to 4 or 5 integrator stages for an analog implemented current input analog-to-digital converter (I-ADC) 106. In some embodiments, the first integrator stage comprises a single-stage operational transconductance element (OTA), which greatly reduces power consumption, offers higher bandwidth, etc.

A transconductance element is sometimes also referred to as transconductance amplifier, current conveyor, or similar and is a voltage controlled current source. One beneficial characteristic of a transconductance element in the present context is that the input impedance of it is relatively large, e.g. even in the GΩ range. In some embodiments, the input impedance of the transconductance element 104 is larger than 100 MΩ, such as larger than 1 GΩ.

As mentioned, the transconductance element 104 scales the received sensor signal denoted '$V_{in}$' in FIG. 2 (e.g. a received microphone signal or other sensor signal) received from a sensor 102 (e.g. a transducer element) according to the predetermined transconductance gm of the transconductance element 104 and produces a current sensor signal $I_{out}$ (e.g. a microphone signal) according to $I_{out}=gm*V_{in}$. The transconductance element 104 is provided with a supply voltage, denoted '$V_{DD}$' in FIG. 2, in relation to an electrical reference potential such as electrical ground. For a transconductance element 104, the dimensionless amplification factor is given by $gm*R_P$, where $R_P$ (see e.g. FIG. 3) is a load resistance of the transconductance element 104 (or an equivalent impedance). $R_P$ is high impedance (see further in the following).

Furthermore, providing a large amplification factor '$gm*R_P$' reduces or minimizes noise and thereby increases or maximizes SNR, respectively, as disclosed herein and in the following. As mentioned, the output node of the transconductance element 104 is high impedance and in some embodiments the load resistance (or its equivalent impedance) $R_P$, at 1 kHz, of the transconductance element is larger than 1 MΩ, preferably larger than 10 MΩ such as larger than 50 MΩ. In some embodiments, the predetermined transconductance gm is larger than 1/(400 kΩ) and preferably larger than 1/(5 kΩ). The multi-rate current-input analog-to-digital converter (I-ADC) 106 enables use of the (high impedance) current output of the transconductance element 104 and enables significant reduction of noise and thereby significant improvement of SNR.

Figure 3:
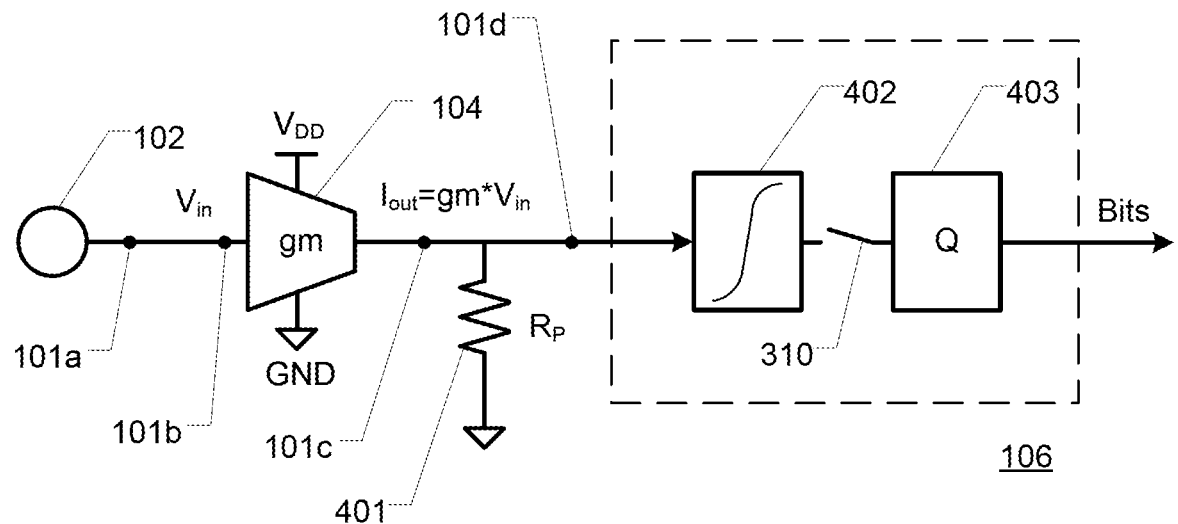
FIG. 3 schematically illustrates a simplified electrical block diagram of an integrated circuit connectable to an output of a sensor in a sensor assembly with an exemplary embodiment of a multi-rate current-input ADC (I-ADC) according to various embodiments.
Figure 4:
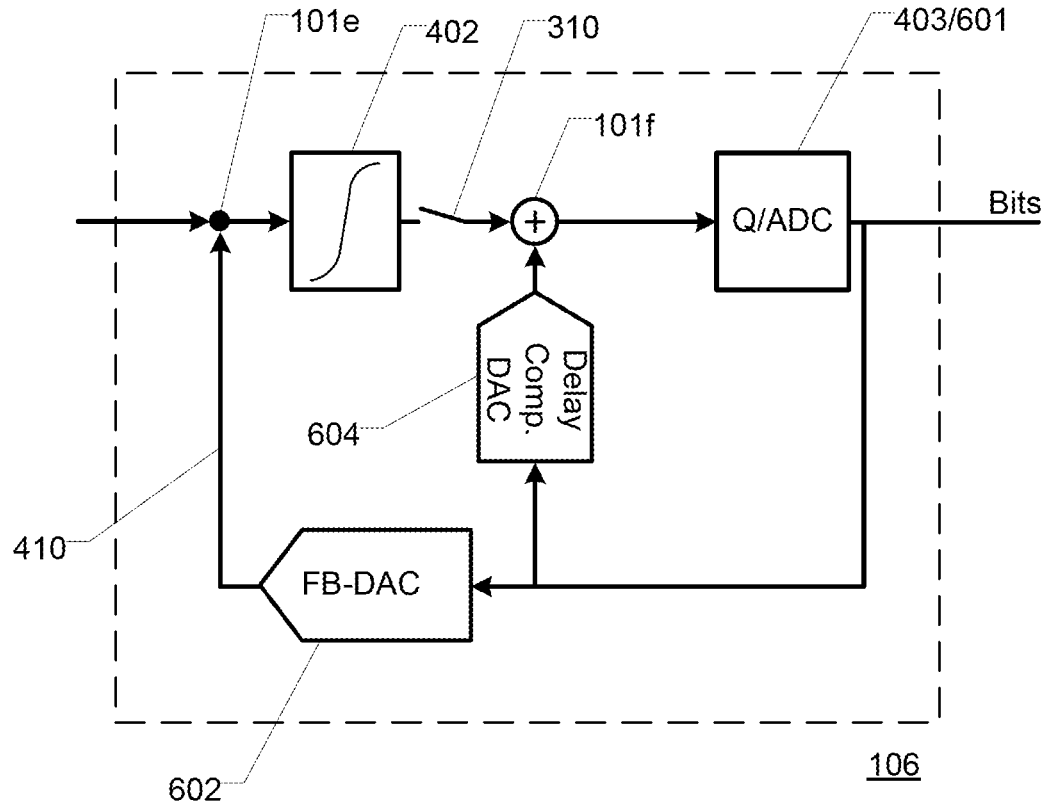
FIG. 4 schematically illustrates a simplified electrical block diagram of more detailed exemplary embodiments of a multi-rate current-input ADC e.g. according to FIG. 3 and according to various further embodiments.

The multi-rate current-input analog-to-digital converter I-ADC 106 may e.g. be equivalently realized or embodied, e.g. as illustrated in FIG. 3, by a first and at least a second integrator stage or the like (see e.g. 402 in FIGS. 3 and 525 in FIG. 5) connected in series with a voltage-input quantizer (denoted 'Q'; see e.g. 403 in FIGS. 3 and 4). The integrator stages may e.g. be implemented as a cascade of integrators with feed-forward summation (CIFF) (see e.g. FIG. 5) or in other suitable ways. An advantage of implementing as a CIFF structure is e.g. that the associated delay is relatively small and therefore well suited for low latency requirement algorithms/systems like noise cancelling and high-frequency applications like ultra sound receivers.

According to a first aspect as disclosed herein, the first integrator stage is a continuous-time (CT) integrator stage, i.e. operating in continuous time, while the second integrator stage (and if present any further integrator stages or at least one of the two or more integrator stages) is a discrete-time (DT) integrator stage, i.e. operating in discrete time. The continuous-time (CT) first integrator stage provides an 'anti-aliasing' effect in the sense that high-frequency noise above the clock frequency of the I-ADC 106 is attenuated thereby reducing the input (to the I-ADC) noise. In effect, the anti-aliasing effect will be corresponding to a low pass filter of order M, where M is the number of continuous-time (CT) integrator stages. Furthermore, analog DT circuits are less costly to implement than corresponding CT circuits. For at least some certain traditional high-frequency applications in the present context, the integrator stages are normally implemented only as discrete-time (DT) integrator stages. Such implementations require a dedicated anti-aliasing filter, adding complexity, costs, and implementation size of the I-ADC 106, which is avoided according to the first aspect. Additionally, it becomes simpler to implement an 'aggressive' (i.e. substantial out of band gain) noise transfer function (NTF) since losses may be introduced fairly simply in the discretre-time (DT) integrator stage(s) to keep it/them stable with respect to potential overload. It should also be noted, that the possible gain for a CT first integrator stage is much higher than the possible gain of a corresponding DT first integrator stage. The CT gain is a combination of $R_P$ and the gain of the CT first integrator stage. Further advantages of integrator stages operating in such a mix of continuous-time (CT) and discrete-time (DT) in connection with other elements are given in the following. The total input referred noise of an integrated circuit 122 as disclosed herein is reduced significantly when using a transconductance element 104 in combination with the multi-rate current-input analog-to-digital converter (I-ADC) 106 as disclosed herein. It is possible achieve a signal transfer function (STF) of approximately 1 (i.e. very close to 1) (e.g. depending on how input and output is defined) and a noise transfer function (NTF) being much smaller than 1 (i.e. <<1) and virtually approximately about 0 (i.e. very close to 0), respectively, of an integrated circuit 122 connectable to an output of a sensor in a sensor assembly according to the embodiment(s) disclosed herein. The main contributors to the overall noise of the I-ADC 106 is the respective noise contributions of the first integrator stage 402, the quantizer Q 403, and $R_P$ 401 (see FIG. 3).

Therefore to reduce the total noise voltage, the product of gm and $R_P$ should be large, for example at least larger than 5, as discussed in the following and herein. The total noise voltage may for example be decreased by increasing the respective value of gm and/or of $R_P$ to the largest practically possible value for a given use or application. A large value of $R_P$ reduces the input noise contribution from the equivalent input impedance of the I-ADC, which is easily implemented in integrated semiconductor technology. Furthermore gm*$R_P$ should be at or above a predetermined value, e.g. at about 5, preferably larger than 10, more preferably larger than 20 or larger than 50, more preferably larger than 200, or larger than 1000, which will reduce the noise contribution from the first integrator stage 402 significantly. In some embodiments, the load resistance (or its equivalent impedance) $R_P$, at 1 kHz, of the transconductance element is larger than 1 MΩ, preferably larger than 10 MΩ such as larger than 50 MΩ, when the predetermined transconductance gm is larger than 1/(400 kΩ) and preferably larger than 1/(5 kΩ). In some embodiments, the load resistance (or its equivalent impedance) $R_P$, at 1 kHz, of the transconductance element is about 5MΩ and the predetermined transconductance gm is about 1/(5 kΩ). In some other embodiments, the load resistance (or its equivalent impedance) $R_P$, at 1 kHz, of the transconductance element is about 10 MΩ and the predetermined transconductance gm is about 1/(2.5 kΩ). This provides a significant reduction of noise.

The I-ADC 106 is configured to generate the multibit digital sensor signal with samples of two, three or four or more bits with a sampling frequency depending on type of sensor, purpose, implementation, etc. In embodiments where the multibit digital sensor signal is a multibit digital microphone signal the sampling frequency may lie between 1 MHz and 20 MHz, such as between 2.048 MHz and 4.196 MHZ, for example 3.092 MHz. In some embodiments, the number of bits representing the multibit digital sensor signal is from about 2 to 3 to about 8 to 10.

Further embodiments of an I-ADC 106 is disclosed herein and e.g. shown and explained in connection with FIGS. 3-8.

Exemplary embodiments and variations thereof of the transconductance element 104 are further described in the Patentee's U.S. application 62/687,198 (therein referred to as transconductance amplifier 104, e.g., in connection with FIG. 6 thereof), which is incorporated herein by reference in its entirety.

Optionally for embodiments where the sensor assembly is a miniature microphone assembly, the (noise reduced/minimized) output, i.e. a digital microphone signal, of the current-input analog-to-digital converter I-ADC 106 is provided or transmitted to an input of a command and control interface 110, denoted SDAT in FIG. 2, in some embodiments configured to receive various types of data commands from a host processor (now shown) of a portable communication device (e.g. a smartphone). The command/control interface 110 may include a separate clock line 116 (CLK) that clocks data on a data line 118 (DATA) of the interface 110. The command and control interface 110 may include a standardized data communication interface according to various serial data communication protocols, e.g., $I^2C$, USB, UART, SoundWire or SPI. The command and control interface 110 is in some embodiments configured to structure and encode the digital microphone signal in accordance with the relevant protocol of the interface 110 and transmits the digital microphone signal to the host processor. The microphone assembly 100 may be configured to receive and utilize various types of configuration data transmitted by the host processor. The configuration data may include data concerning a configuration of the integrated circuit 122.

FIG. 3 schematically illustrates a simplified electrical block diagram of an integrated circuit connectable to an output of a sensor in a sensor assembly with an exemplary embodiment of a multi-rate current-input ADC (I-ADC) according to various embodiments.

The sensor 102 (e.g. a transducer element) and the transconductance element 104 correspond to the ones shown and explained in connection with FIG. 2 and/or as otherwise disclosed herein including relevant variations and embodiments.

The shown current-input ADC (I-ADC) 106 comprises a first integrator stage for receipt of the current signal (e.g. in some embodiments as a combination with one or more other signals as disclosed herein) and a least a second integrator stage 402 and a quantizer 403 (denoted 'Q').

In at least some embodiments, the first and at least second integrator stage is current sensitive integrator stages. As mentioned, the first integrator stage is a continuous-time (CT) integrator stage while at least one, e.g. all, of the at least second integrator stage is(are) discrete-time (DT) integrator stage(s). The integrator stage(s) 402 and the quantizer Q 403 are connected in series with a switch or similar 310 there between (for sampling purposes) where the quantizer Q 403 receives the output of the integrator stages. In some embodiments, the quantizer Q 403 is a mid-tread type quantizer, i.e. a zero output level of the quantizer Q is used/present and the number of levels is un-even. The quantizer Q 403 is configured to generate a digital sensor signal (corresponding to an input sensor signal as represented by the current signal output from the transconductance element 104) based on output of the first and the at least a second integrator stage 402 as disclosed herein. The quantizer Q 403 comprises an analog-to-digital converter, e.g. a flash ADC, a Successive Approximation (SA) ADC, or any other suitable type of ADC.

Additionally illustrated in FIG. 3 is a load resistance of the transconductance element or an equivalent impedance $R_P$ 401 that (virtually) is connected in parallel with the integrator stages 402 and the quantizer Q 403. As mentioned, $R_P$ is high impedance whereby the first integrator stage will receive basically all the supplied current. The sensor 102 is connected to a sensor output 101a that is connected to an input node or terminal 101b (also designated herein as a third input node) of the transconductance element 104. An output node 101c of the transconductance element 104 is connected to an input node 101d (the first input node) of the I-ADC 106 and the impedance $R_P$ (being equivalent to the load resistance of the transconductance element) is (virtually) located between the output node 101c and the input node 101d. Some of the nodes may be shared or combined. The equivalent impedance $R_P$ may—for embodiments corresponding to the one in FIG. 3—be a combination of the output resistances of the transconductance element and any parasitic output impedances of circuit elements connected to the I-ADC input node 101d. In some such further embodiments, the impedance $R_P$ is the parallel combination of output impedances of all circuit elements connected between the input of the I-ADC 106 and an electrical reference potential such as electrical ground, including leakage through any bias and protection circuits.

Figure 6B:
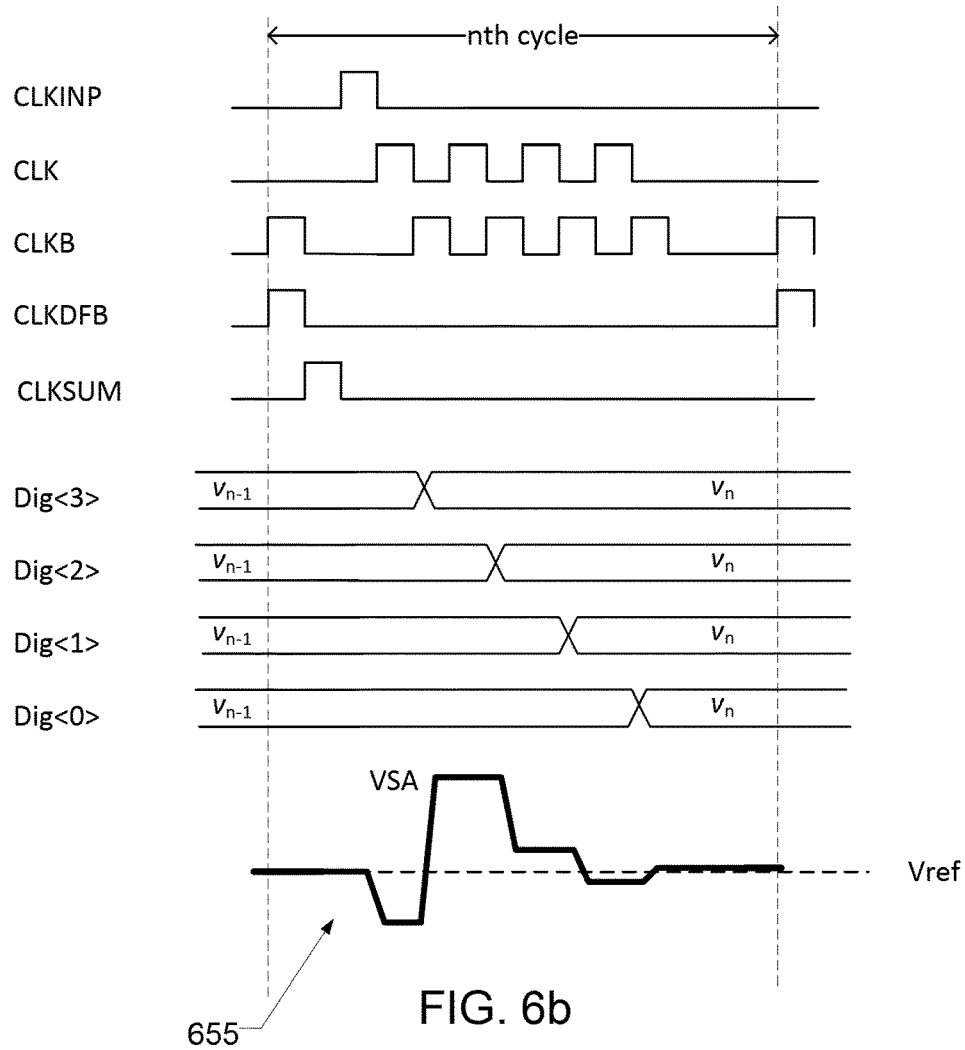
FIGS. 6a and 6b schematically illustrate a simplified schematic circuit diagram and an output and control signals of an exemplary SA ADC suitable for integration or incorporation in the integrated circuit according to various embodiments.
Figure 6A:
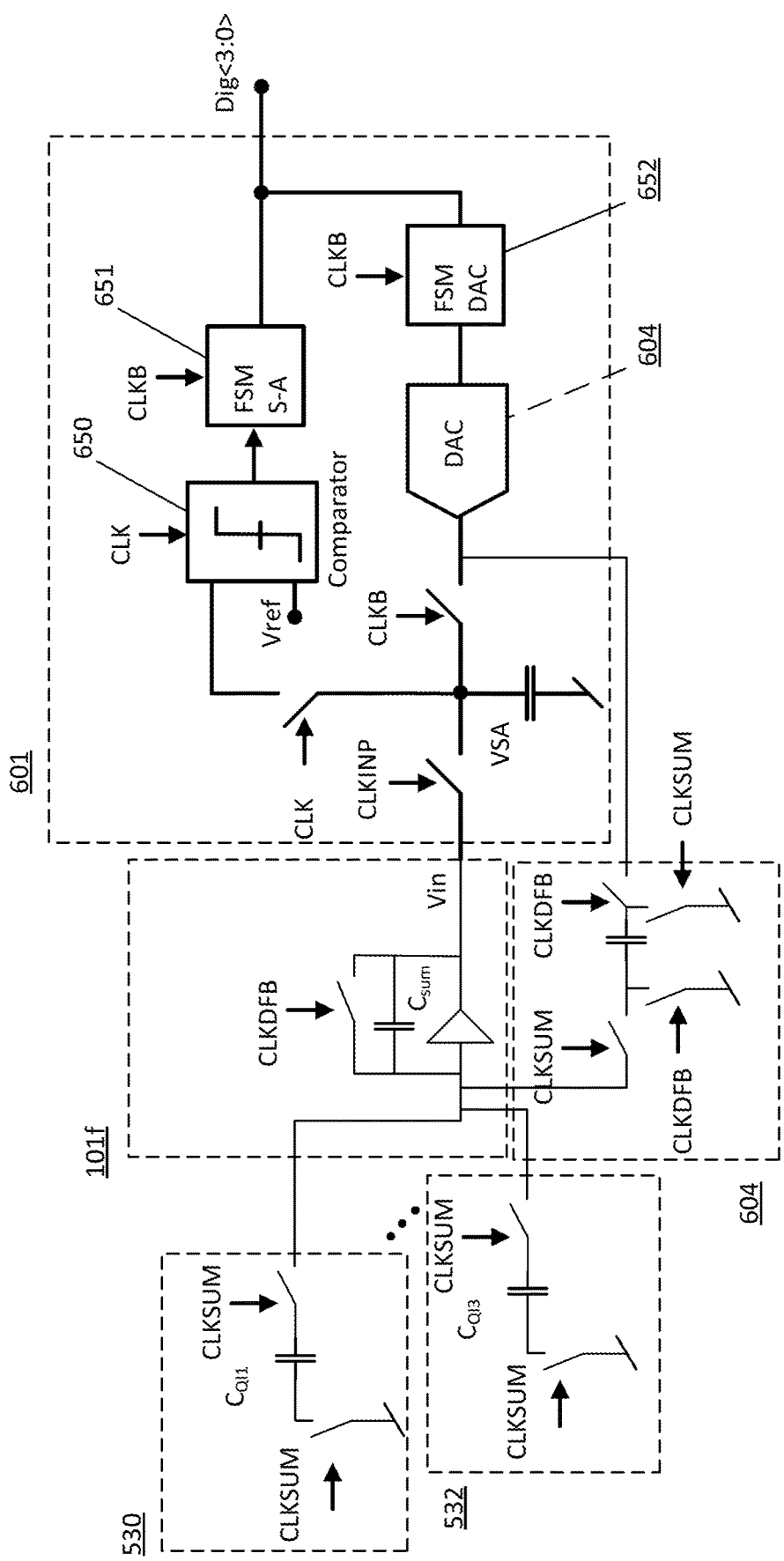

Embodiments of the quantizer Q 403 as disclosed herein are illustrated and explained further e.g. in connection with FIGS. 4, 6a, and 7 also illustrating additional elements of the multi-rate current-input analog-to-digital converter I-ADC 106 according to some embodiments.

In some embodiments, the multi-rate current-input analog-to-digital converter I-ADC 106 further comprises an (additional) feed-forward path (not shown) that is connected at a first end to the first input node 101d (also connected to receive the output of the transconductance element 104) thereby receiving the current signal and being connected at a second end to a summation node or similar (also referred to as fourth input node; see e.g. 101f in FIG. 4 or 5) where the summation node or similar is configured to add (or combine) the signal of the feed-forward path to (or with) the output of the integrator stages 402 where the result of the summation (or other combination) is provided to the quantizer Q 403. The signal of the feed-forward path may e.g. be a mirror or copy of $I_{out}$ being multiplied by 1/gm to convert back to a voltage before summation at the summation node (fourth input node). The current to voltage conversion could alternatively be done in another way, e.g. by a sampling cap, etc. or it could be provided in another way, e.g. by providing an internal voltage output from inside the transconductance element 104. It is noted, that noise from the feed-forward path is attenuated by the NTF. The feed-forward path is configured to operate in continuous time (CT) and at a frequency being equal to the clock frequency of the I-ADC 106 (also referred to as the first clock frequency). Such a feed-forward path enables that only quantization noise will be present in the integrator stages 402 and that the respective outputs of the integrator stages is frequency independent.

FIG. 4 schematically illustrates a simplified electrical block diagram of more detailed exemplary embodiments of a multi-rate current-input analog-to-digital converter (I-ADC) 106 (e.g. according to FIG. 3) and according to various further embodiments. The illustrated integrator stages 402 and the quantizer Q 403 correspond to respective ones as disclosed herein and e.g. as described in connection with FIGS. 2 and 3.

The quantizer Q 403 is according to some embodiments, and as illustrated, implemented by or comprises a voltage-input analog-to-digital converter (denoted 'ADC') 601.

In some embodiments, and as shown, the I-ADC 106 comprises a feedback path, the feedback loop or path connecting the output of the quantizer Q 403 or the ADC 601 to a node or similar 101e (also designated as the second input node herein) of the I-ADC 106 whereby the feedback loop or path is provided across the integrator stages 402 and the quantizer Q 403 or ADC 601, i.e. the feedback loop or path extends at least from the digital sensor signal at the output of the quantizer Q 403 and back to the input of the first integrator stage 402 at the second input node 101e. The I-ADC 106 is configured to add the output signal of the quantizer (Q) (or a feedback signal 410 derived therefrom; see the following) to the current signal (provided by the transconductance element 104) at the second input node 101e and to supply the resulting current as an input current signal to the first integrator stage 402 thereby closing the feedback loop or path. Alternatively, the output signal of the quantizer Q may be combined in another suitable way with the current outputted by the transconductance element 104 (or with a signal based on the outputted current) where the result of the combination then is supplied as input to at least the first integrator stage.

Further shown and comprised by the I-ADC 106 is a current-output feedback digital-to-analog converter 602 (denoted 'FB-DAC') located in the feedback loop or path. The ADC 601 receives the output of the integrator stages 402, in some embodiments e.g. further modified as explained in the following, and provides as disclosed herein a multibit digital sensor signal (denoted 'Bits') representative of the sensor signal as the output of the I-ADC 106. The multibit digital sensor signal is also provided from the ADC 601 to the FB-DAC 602. The FB-DAC 602 is configured to provide a feedback signal 410 in response to the provided corresponding digital sensor signal where the feedback signal 410 is provided to the second input node 101e to be added with the current signal as explained above. In some embodiments, the ADC 601 and the FB-DAC 602 both operate at an uneven level, e.g. N−1 levels where N is the level of the Quantizer Q 403.

The current-output FB-DAC 602 receives the multibit digital sensor signal (denoted 'Bits' in FIG. 4) that is also output by the I-ADC 106 and converts it into a current signal representation of the bit value of the multibit digital sensor signal.

According to the illustrated embodiment, and corresponding ones, the output signal from the transconductance element (see e.g. $I_{out}$, 104 in FIGS. 2 and 3) is added to the current output of the FB-DAC 602 and the resulting current, being an error signal, is integrated into a voltage by the integrators 402. The shown embodiment can be implemented in a simple way so that the amplitude of this integrated error signal is less than $V_{DD}$ without a need to reduce $R_P$, thereby allowing for both lower noise and a high gain or amplification factor of the signal present before the I-ADC 106. Since, such integrated error signal is less than $V_{DD}$, clipping or the like of $I_{out}$ is avoided, which could otherwise lead to a distorted sensor signal in certain situations.

In some embodiments, the current output FB-DAC 602 is an $N^{th}$ level current steering FB-DAC where N is the number of levels of the multibit digital sensor signal being output by the I-ADC 106, i.e. Bits. FIG. 7 illustrates an $N^{th}$ level current steering FB-DAC according to some embodiments. A current steering (FB) DAC is particularly well suited for high frequency applications such as e.g. gigahertz applications and especially if the analog output is to be delivered to a resistive load. Alternatively, the FB-DAC may be embodied in other suitable ways. In some further embodiments, the feedback loop may further comprise a DELM (dynamic element matching) element or circuit (see e.g. 703 in FIG. 7), e.g. located between the quantizer Q 403/the ADC 601 and the FB-DAC 602, configured to switch or rotate between used or activated components (i.e./e.g. respective current sources) of the current steering FB-DAC to avoid that some components (current sources of the current steering FB DAC) are used more often than others (which introduces unwanted non-linearity) or at least reduce the effect of this.

A current steering FB-DAC 602 may be prone to jitter sensitivity. In some embodiments, the I-ADC 106 further comprises a pulse correction element or circuit, e.g. implemented by a comparator element or circuit, configured to receive a mirror of the DAC current and being configured to receive a clock control signal and to provide an output signal having a fixed pulse width generated in response to the clock control signal thereby avoiding or at least significantly reducing jitter. See FIG. 8 for an exemplary embodiment of a pulse correction element or circuit. The pulse correction element or circuit may e.g. be located before the current steering FB-DAC 602 in the feedback path or in connection thereto. In relation to such a pulse correction element or circuit it is a further advantage that the first integrator stage is a continuous-time (CT) integrator stage since it becomes possible to perform jitter correction or reduction without needing information of what value the FB-DAC signal is, i.e. it does not matter when the feedback signal of the FB-DAC 602 is present within an overall clock period as long as the pulse duration is constant (jitterfree).

The ADC 601 may be any suitable $N^{th}$ level output ADC. In some embodiments, the ADC 601 is a flash ADC typically comprising a cascade of parallel comparators connected to a resistor-ladder driven by the most positive and most negative ADC reference voltages. An advantage of flash ADCs is that they are very fast compared to certain other ADCs thereby readily enabling high-frequency applications. A drawback however is that they require a very large number of comparators, especially as the precision or level representing the ADC output code (Bits) increases. The large number of comparators increases power consumption, cost, and implementation size. The required number of comparators of flash ADCs is given up to $2^{N-1}$, N being the number of bits representing the ADC output, i.e. power consumption, cost, and implementation size increases exponentially with the number of bits used for the output code of the ADC, i.e. the output code of the I-ADC 106.

In alternative embodiments, a successive approximation analog-to-digital converter, such as a Successive Approximation (SA) ADC is used as the ADC 601. This significantly reduces power consumption, cost, and implementation size as the complexity of a SA ADC does not increase exponentially with the number of bits representing the ADC output. As an illustration a particular implementation of a SA ADC may e.g. use about 3 mA while a corresponding flash ADC implementation will use between 50 to 100 mA, i.e. the power reduction is significant. However, such SA ADCs are slower compared e.g. to Flash ADCs, due to the successive approximation nature, and would otherwise need a relatively big part of an overall clock cycle of the I-ADC 106 thereby making them generally infeasible for high-frequency applications. To address this, the clock of the SA ADC (also denoted second clock frequency) is overclocked or increased, e.g. by a factor of 8, compared to the overall I-ADC 106 clock (also denoted first clock frequency) and furthermore a delay, is introduced in the quantizer Q 403 or more specifically in the SA ADC 106 of the I-ADC 106 and potentially other circuits located in the feedback path. The introduction of a delay readily enables use of an SA ADC or similar by operating it a higher clock frequency as there now are clock cycles available for the relatively slower operation of the SA ADC (compared to a flash ADC or similar) and potentially other elements. If present, the DELM element or circuit is also operating at the higher second clock frequency or at another increased clock frequency thereby readily providing sufficient time (e.g. one clock cycle of the higher second clock frequency) for its operation (generating a DELM output) without adding delay to the output of the I-ADC 106, i.e. at the first clock frequency. See e.g. FIGS. 6a and 6b for an exemplary implementation of a SA ADC according to some embodiments.

The introduction of a delay in the feedback path changes the noise transfer function (NTF) and therefore a delay compensation DAC 604 is, in some embodiments, introduced (operating at the overall first clock frequency) being configured to ensure that the NTF after the introduction of delay otherwise is the same as without delay. The delay compensation DAC 604 may e.g. be a direct feedback DAC with a gain ensuring that the NTF is compensated for the delay and receives the multibit digital sensor signal also being output from the I-ADC 106 and adds (or combines in another suitable way) its output to the output of the integrator stages 402 at a summation node or similar (also denoted the fourth input node) (see e.g. 101f in FIGS. 4 and 5) where the result of the summation (or other combination)

is provided to the quantizer Q 403 or the SA ADC 601. The delay compensation DAC 604 provides converted values (i.e. the output of the quantizer Q 403/SA ADC 601) as analog values (potentially scaled) for adding in the next cycles input. Additionally, it is noted that due to the first integrator stage being a continuous-time (CT) integrator stage, the gain of the direct feedback DAC and/or the feedback coefficients of the integrator stages 402 (if implemented using such) becomes independent of the overall clock frequency (i.e. the first clock frequency) of the I-ADC 106. FIG. 6*a* illustrates a possible implementation of the delay compensation DAC 604 according to some embodiments. A switch or similar 310 (for sampling purposes) is located between the integrator stage(s) 402 and the quantizer Q 403 and more particularly between the integrator stage(s) 402 and the summation node/fourth input node 101*f*.

Accordingly, by providing time (due to running at the higher second clock frequency) for the SA ADC 601 and, if present, for the DELM element a substantial amount of power is saved and implementation area reduced. In at least some embodiments, the SA ADC 601 may use N+1 (N being the number of bits of the I-ADC 106 output) clock cycles at the higher second clock frequency while the DELM element may use a single clock cycle (or more) at the higher second clock frequency. Alternatively, the ADC 601 may be embodied in other suitable ways.

Figure 5:
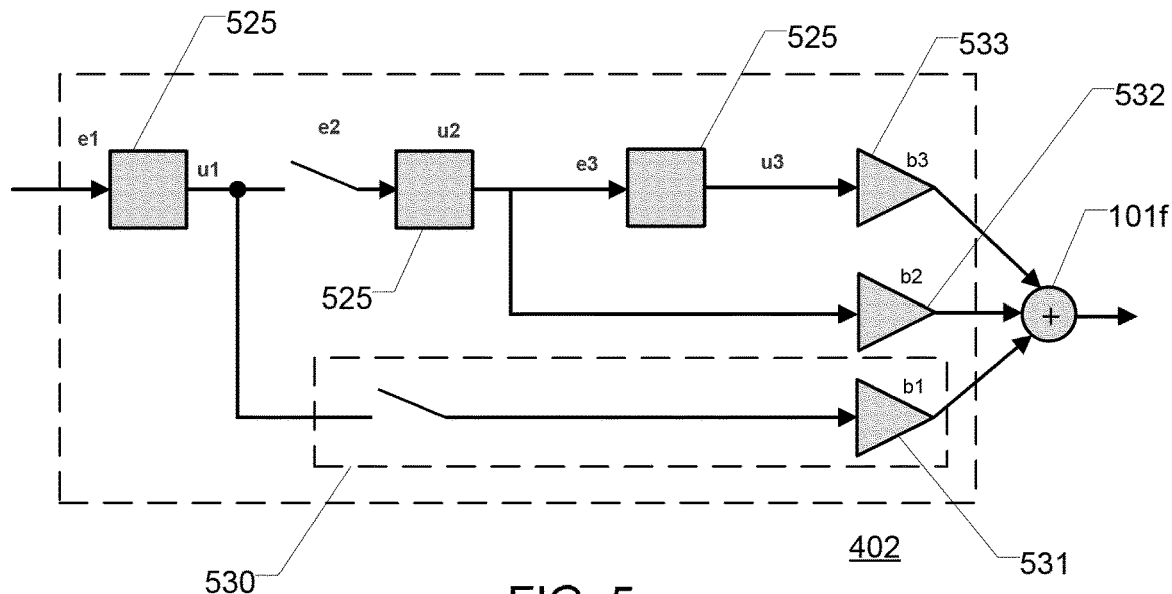
FIG. 5 schematically illustrates a simplified electrical block diagram of an exemplary embodiment of a number of integrator stages of FIG. 3 or 4 suitable for integration or incorporation in the integrated circuit connectable to an output of a sensor.

FIG. 5 schematically illustrates a simplified electrical block diagram of an exemplary embodiment of a number of integrator stages of FIG. 3 or 4 suitable for integration or incorporation in the integrated circuit connectable to an output of a sensor.

According to the shown exemplary and corresponding embodiments, the integrator stages 402 (in the shown particular example three individual integrator stages 525; a first CT and two (second and third) DT integrator stages) is implemented by a cascade of integrators with feed-forward summation (CIFF) that is well known structure in connection with ADCs. The first CT integrator stage may e.g. be implemented as a switched inverter. In the present context, the integrator stages 402 is configured so that any gains does not change in the loops and that all signals (Vs, Vq, e1, e2, e3, u1, u2, u3) are preserved including NFT, signal transfer function (STF), maximum stable amplitude (MSA), and step sizes. The (voltage) outputs of the respective integrators stages 525 are scaled by applying respective scaling factors b1, b2, b3 by respective connected scalers 531, 532, 533 and are received by a summation node or similar 101*f* (also denoted the fourth input node) (e.g. together with the output of the delay compensation DAC 604) where the result of the summation (or other combination) is provided to the quantizer Q 403 or the SA ADC 601. Thereby the scalers 531, 532, 533 scale the respective signals and thereby their respective contribution to the summing node 101*f*. Alternatively, other implementations of integrator stages may be used. Additionally, another number of integrator stages than three may be used. FIG. 6*a* illustrates possible implementations of the scalers 531, 532, 533 and the summation node or similar 101*f* according to some embodiments.

FIGS. 6*a* and 6*b* schematically illustrate a simplified schematic circuit diagram and an output and control signals of an exemplary SA ADC suitable for integration or incorporation in the integrated circuit according to various embodiments.

FIG. 6*a* schematically illustrates a simplified schematic circuit diagram of an exemplary SA ADC suitable for integration or incorporation in the integrated circuit according to various embodiments. Shown is a SA ADC implementation 601 involving only a single comparator 650 thereby reducing complexity, implementation size, and power consumption. The comparator 650 will successively test/compare (when active) at each clock cycle of the control signal CLK whether the current voltage value $V_{SA}$ (being the successively approximated output) is smaller or larger than $V_{ref}$ (being half of the full-scale input) and with each test, adjust (in smaller and smaller adjustments) $V_{SA}$ according to the well-known successive approximation principle for SA ADCs (reduce $V_{SA}$ if $V_{SA} > V_{ref}$ and increase $V_{SA}$ if $V_{SA} < V_{ref}$) to become closer and closer to $V_{ref}$ as illustrated in the graph 655 in FIG. 6*b*. At each step, the adjusted $V_{SA}$ is fed back to the comparator 650, via a finite state machine (FSM S-A) 651 and a FSM DAC 652 both controlled by control signal CLKB, a DAC and the shown switches, for comparison at the next step.

Once done, the multibit digital sensor signal (denoted 'Dig<3:0>' in FIGS. 6*a* and 6*b* and 'Bits' in other FIGS.) has been generated based on the resulting final value of $V_{SA}$ according to an encoding scheme dependent on specific use or implementation of the sensor signal. As previously mentioned, such an approach takes some time (available due to the increased clock frequency), but is very efficient in relation to power usage and implementation size.

Illustrated are also switched capacitor implementations of the (here three as an example) scalers 531, 532, 533 (see also FIG. 5) of the integrator stages 402 operated according to the control signal CLKSUM and the summation node or similar (also denoted the fourth input node) 101*f* (see also FIGS. 4 and 5) operated according to control signal CLKDFB where the result of the summation (or combination) for the previous cycle (cycle n−1) is provided as $V_{in}$ to the SA ADC 601 (or quantizer Q) to be used in generating the result for the current cycle (cycle n). More specifically, the voltage $V_{in}$ (at cycle n−1) is initially transferred to the capacitor labeled $V_{SA}$ via a switch controlled by the control signal CLKINP. Comparing FIGS. 5 and 6*a* then u1 in FIG. 5 is sampled by $C_{QI1}$ of FIG. 6*a*, u2 is sampled by $C_{QI2}$, and u3 is sampled by $C_{QI3}$. Additionally, shown is also a switched capacitor implementation of the delay compensation DAC 604. It should be noted, that in the shown implementation the DAC for use in the SA ADC 601 is actually used also as the DAC needed for the delay compensation DAC 604, which is possible since the SA ADC 601 and the delay compensation DAC 604 does not—in this embodiment—need to be used at the same time due to running the DAC overclocked. Accordingly, a DAC is saved thereby saving power usage and implementation size (where a DAC typically is one of the largest and most expensive components in integrated circuits within the present context).

FIG. 6*b* illustrates the timing and values of the various used control signals for a given overall cycle (n-th cycle) controlling the circuit of FIG. 6*a* as well as the successively approximated signal output VSA and the multibit digital sensor signal. The CLKSUM signal in FIG. 6 is in phase and aligned with the clock for the track/hold elements in 530, 531, 532, with a low value being "track" and a high value being "hold.". The other clocks in FIG. 5 and FIG. 6. are internally generated by the SA ADC 601 or the quantizer Q.

Figure 7A:
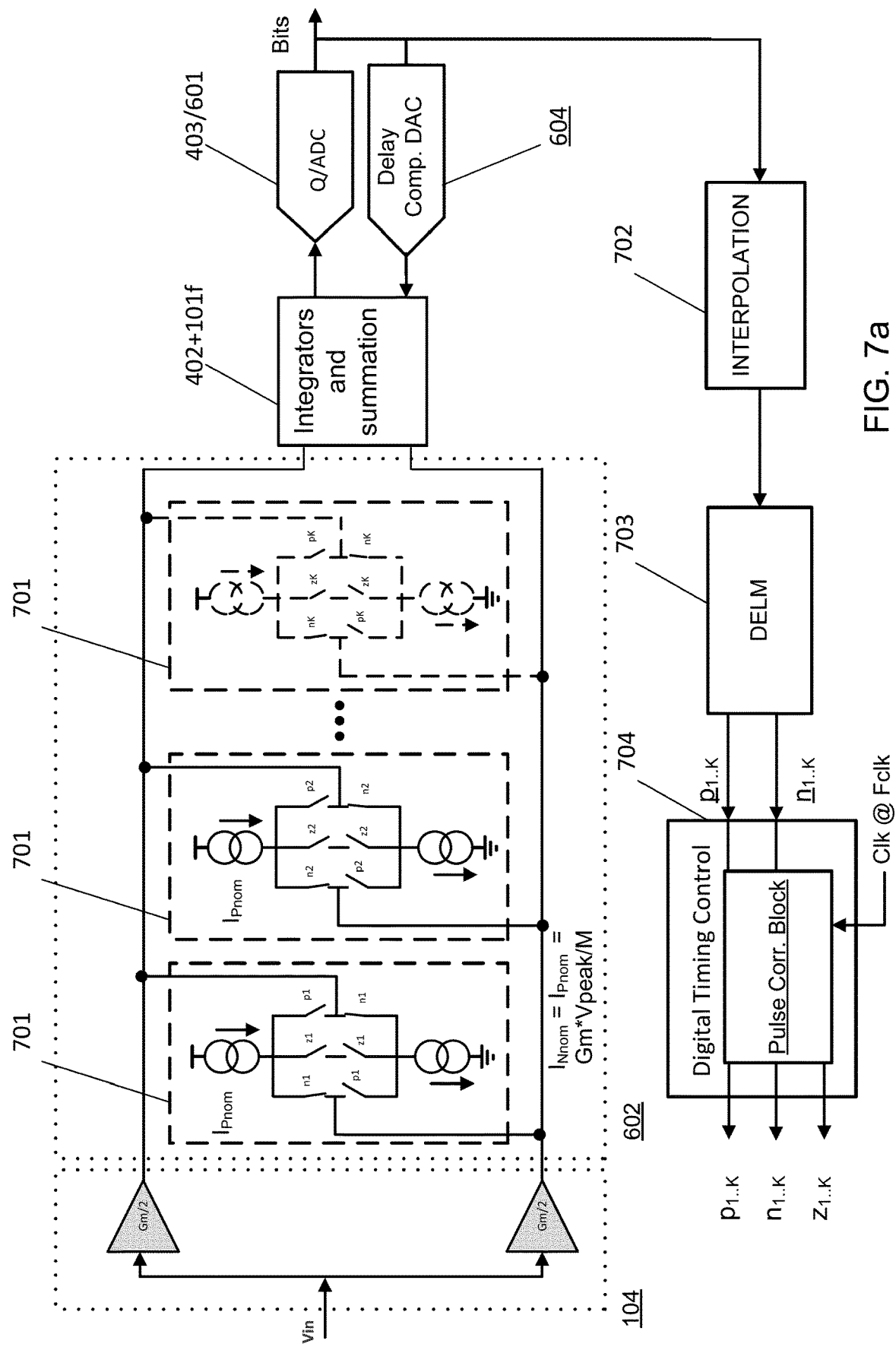
FIGS. 7a and 7b schematically illustrate a simplified electrical block diagram of an integrated circuit according to various embodiments with an exemplary feedback digital-to-analog converter (FB-DAC) implementation and the corresponding timing diagrams.
Figure 7B:
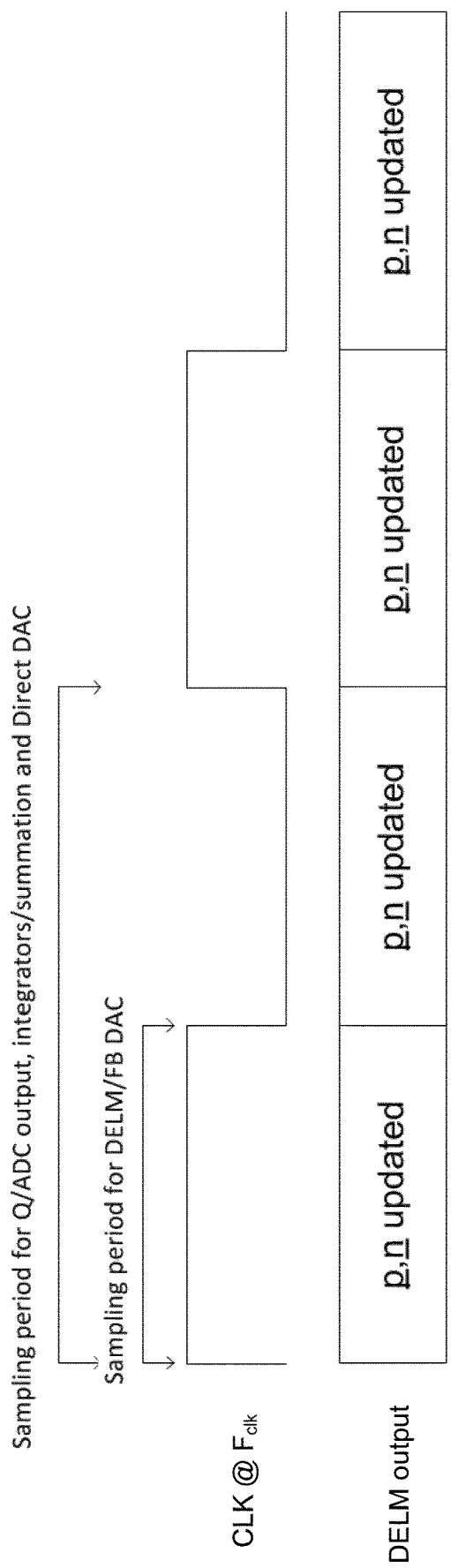

FIGS. 7*a* and 7*b* illustrate a simplified electrical block diagram of an integrated circuit according to various embodiments with an exemplary non-return-to-zero (NRZ) feedback digital-to-analog converter (FB-DAC) implementation and the corresponding timing diagrams. Shown are a current output transconductance element 104 and an $N^{th}$ level current steering FB-DAC 602 as disclosed herein; in the shown embodiment both differentially implemented. The $N^{th}$ level current steering FB-DAC 602 comprises a number (here K) of controllable current feedback sources 701 each having switches as shown controlled by respective control signals p, z, n (three signals for each current feedback source 701). In some embodiments, K=M/2, where M=Nlev−1 where Nlev is the number of levels in the Quantizer Q 403/ADC 601. The switches controlled by p and the switches controlled by n is not closed at the same time. The current steering FB-DAC 602 is connected to integrator stages 402 and a summation node or similar (also referred to as fourth input node) as disclosed herein where the result of the summation (or combination) is provided to the quantizer Q 403 or the ADC 601 as disclosed herein. A delay compensation DAC 604 as disclosed herein is shown in the feedback path or loop and connector the node 101f as disclosed herein. According to this embodiment, the feedback path or loop further comprises an interpolation element 702 e.g. in the form of a simple holding circuit, e.g. implemented as a first order, second order, third order, etc. FIR (finite impulse response) filter receiving the multibit digital sensor signal (denoted 'Bits') from the quantizer Q 403 or the ADC 601. Connected in series to the interpolation element 702 in the feedback path or loop is a dynamic element matching element or circuit 703 (DELM) configured to switch or rotate between used or activated components of the current steering FB-DAC. The applied DELM algorithm may e.g. be a first or second order DELM.

In some embodiments, the DELM 703 operates at the higher second clock frequency or at another increased clock frequency (also denoted a predetermined third clock frequency) being an integer multiple of the predetermined first clock frequency. The third clock frequency may e.g. be twice the overall clock frequency of the I-ADC 106 (also referred to as the first clock frequency). Operating the DELM at twice the first clock frequency increases the SNR with respect to inband MNP (mismatch noise power), e.g. by about 6-9 dB. The DELM may in other embodiments, run at three times the first clock frequency, or even more. The DELM 703 may e.g. comprise a thermometer encoder and decoder if needed.

The DELM 703 is connected to a digital timing control element 704, operating at the same clock frequency as the DELM 703, and responsible for deriving the K number of signal triples (p, z, n) as generally known for current steering FB-DACs. Accordingly, the current sources' control signals are changed (as specified by the DELM 703) at the increased clock frequency thereby switching more often between current sources.

In the shown embodiment of FIG. 7a, the digital timing control element 704 comprises a pulse correction circuit (see e.g. 800 in FIG. 8) receiving output signals (p, n) from the DELM 703 and being configured to control the z digital signals and turn the pulses off after each DELM update. This part is at least in this embodiment a return-to-zero scheme.

FIG. 7b illustrates the corresponding timing diagrams of the feedback digital-to-analog converter (FB-DAC) implementation of FIG. 7a illustrating the control clock (CLK@$F_{CLK}$) of the pulse correction circuit, the timing of the DELM output and indications of respective sampling periods of various elements and circuits.

Figure 8:
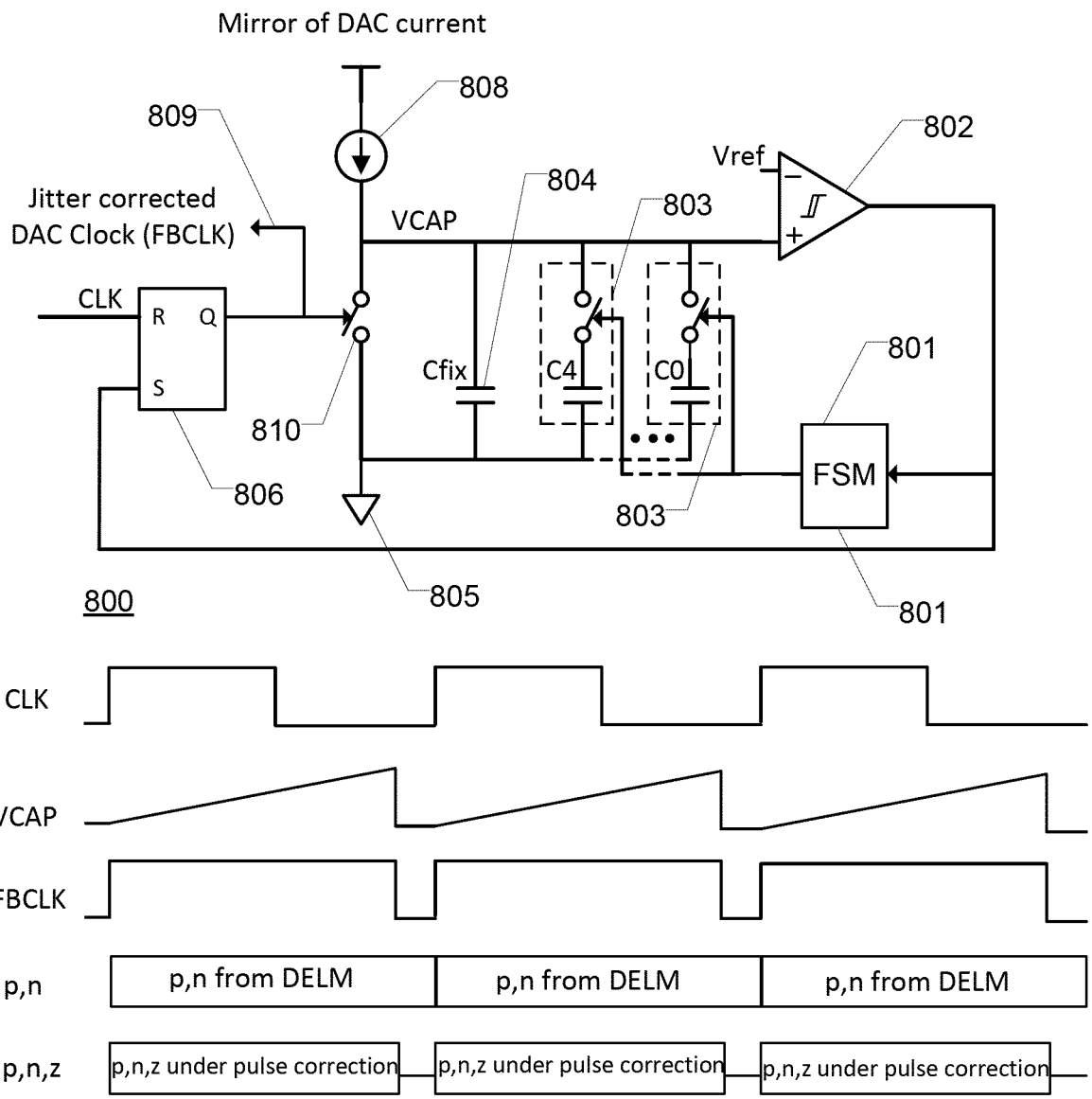
FIG. 8 schematically illustrates a simplified electrical block diagram of a pulse correction circuit suitable for integration or incorporation in the integrated circuit according to various embodiments and the corresponding timing diagram.

FIG. 8 schematically illustrates a simplified electrical block diagram of a pulse correction circuit suitable for integration or incorporation in the integrated circuit according to various embodiments. Shown is pulse correction circuit 800 comprising a finite state machine FSM 801, a comparator 802, a number of switched capacitors with respective capacitors C0, . . . C4 803, a capacitor Cfix 804, an electrical reference potential such as electrical ground 805, an RS latch or similar 806, a current source 808, an output control signal 809, and a further switch 810.

The switched capacitors C0, . . . C4 803 are together with Cfix 804 connected in parallel in relation to the electrical reference potential 805 and connected to receive the current from the current source 808 and deliver an output to one of the input terminals (+) of the comparator 802. The other input terminal (−) of the comparator 802 receives a reference voltage $V_{ref}$. The comparator 802 compares its two inputs and outputs one signal (e.g. '0') if they are different and another signal (e.g. '1') if they are the same (e.g. within a certain threshold). The output of the comparator 802 is connected as input to the FSM 801 and as input at a terminal (S) of the RS latch 806. The output (Q) of the RS latch 806 is received by the further switch 810. The RS latch 806 further receives a clock control signal CLK as a further input (R). The number of switched capacitors C0, . . . C4 803 correspond to the number of bits that the FSM 801 works with. In the particular shown example that number is five. Each switch of the switched capacitors C0, . . . C4 803 are controlled (on an individual level) by the FMS 801 according to its logic thereby controlling when each switched capacitors C0, . . . C4 803 starts to be charged by the current from the current source 808 and their activation order may also be controlled.

The pulse correction circuit 800 is not active when the further switch 810 is open. The further switch 810 stays open until the clock control signal CLK triggers a change of the output signal Q in turn causing a closing of the further switch 810. When this happens the current from the current source 808 will charge Cfix and any of the switched capacitors C0, . . . C4 803 having their respective switch closed by control of the FSM 801. In some embodiments, all the switches of the switched capacitors C0, . . . C4 803 are open (i.e. only Cfix 804 will be charged in the beginning). The FSM 801 will at predetermined times switch in one or more of the switched capacitors C0, . . . C4 803. The voltage VCAP of the charged capacitors (Cfix, C0, . . . C4 (the ones having their switch closed)) at any given time is received by the comparator 802 at its (+) input. When the voltage received by the comparator 802 reaches $V_{ref}$ then the output of the comparator 802 changes (e.g. from '0' to '1') which is received by input of the RS latch 806 causing its output FBCLK to change thereby opening the further switch 810 stopping the charging of the capacitors. By having calibrated known values of Cfix, C0, C1, C2, C3, C4 it is possible to have the voltage of the capacitors reach $V_{ref}$ at a fairly accurate point in time after the clock control signal CLK triggered a start; even when the clock control signal CLK is prone to jitter. The output control signal 809 FBCLK will not be prone to jitter since it is generated by a starting point (CLK) and a well-defined end point (voltage of capacitors reaches $V_{ref}$). In this way, it is possible to remove or at least substantially reduce jitter from the CLK signal and it is possible to tune out other process variations. In some embodiments, the well-defined end point is so that the pulse width of the output control signal 809 is between about 70% to about 90%, e.g. about 80% of the pulse width of the clock control signal CLK, whereby a delay is provided.

The current source 808 may be a scaled version of current used in 701 (see FIG. 7a) (In_nom and Ip_nom), i.e. it is derived from the same source as 701 and thus tracks temperature and process variations.

The timing of the signals p,n,z for the control of the current sources in FB-DAC are timed so that the updating of p,n,z happens every time FBCLK goes active. The exact timing is shown at the bottom of FIG. 8. The DAC_CLOCK controls the output pulse width of 704. Thus the output pulses or signals of 704 has reduced jitter.

In some embodiments, the FSM 801 may also perform other functions, e.g. as (at least part of) the control of the first (CT) integrator stage (see e.g. 402 and 525 in FIGS. 3, 4, 5).

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. An integrated circuit connectable to a sensor, the integrated circuit comprising:
    a transconductance element connectable to the sensor and having a voltage input and a current output, the transconductance element configured to generate a current signal representative of an output of the sensor; and
    a current-input analog-to-digital converter (I-ADC) including a first input node coupled to the current output of the transconductance element and configured to sample and quantize the current signal to generate a corresponding digital sensor signal, wherein the I-ADC comprises:
        a continuous-time (CT) integrator stage and a discrete-time (DT) integrator stage, the CT integrator stage configured to receive the current output of the transconductance element and the I-ADC configured to generate the digital sensor signal based on an output of the CT integrator stage and an output of the DT integrator stage; and a feedback digital-to-analog converter (FB-DAC) connecting an output of the I-ADC to a second input node of the I-ADC, the FB-DAC configured to provide a feedback signal based on the digital sensor signal, and the I-ADC configured to add the feedback signal to the current signal at the second input node and to supply a result thereof as an input to the CT integrator stage.

2. The integrated circuit of claim 1, wherein:

the I-ADC comprises an analog-to-digital converter (ADC) configured to quantize the output of the CT integrator stage and the output of the DT integrator stage to generate the digital sensor signal;

the I-ADC is a multi-rate I-ADC configured to operate at a first clock frequency;

the ADC is a successive approximation analog-to-digital converter (SA ADC) configured to operate at a second clock frequency, wherein the second clock frequency is an integer multiple of the first clock frequency;

the FB-DAC is configured to operate at the second clock frequency; and the I-ADC is configured to introduce a delay.

3. The integrated circuit of claim 2, wherein the multi-rate I-ADC comprises:

a feedback path connecting the output of the I-ADC to the second input node; and a delay compensation digital-to-analog converter (DAC) connected to the feedback path and to a third input node of the I-DAC, the delay compensation DAC configured to:

operate at the first clock frequency;

receive the digital sensor signal; and add an output of the delay compensation DAC to the output of the CT integrator stage and the output of the DT integrator stage to compensate a noise transfer function of the multi-rate I-ADC for the introduced delay.

4. The integrated circuit of claim 3, wherein the feedback path comprises a dynamic element matching element (DELM) configured to alternate use of different components of the FB-DAC.

5. The integrated circuit of claim 4, wherein the FB-DAC and the DELM are configured to operate at a third clock frequency, wherein the third clock frequency is an integer multiple of the first clock frequency.

6. The integrated circuit of claim 2, wherein the SA ADC comprises a single comparator, a first finite state machine, a second finite state machine, and a DAC.

7. The integrated circuit of claim 6, wherein the DAC of the SA ADC is the delay compensation DAC.

8. The integrated circuit of claim 7, further comprising a pulse correction element configured to receive a clock control signal and to provide an output signal having a fixed pulse width based on the clock control signal.

9. The integrated circuit of claim 8, wherein:

the pulse correction element comprises:
a first capacitor;
at least one switched capacitor;
a finite state machine;
a comparator; and
a further switch operable by the clock control signal; and the pulse correction element is configured to:
charge the first capacitor and the at least one switched capacitor in response to the further switch changing state under control of the finite state machine until a resulting voltage of the first capacitor and the at least one switched capacitor reaches a reference voltage as determined by the comparator; and supply the output signal having the fixed pulse width, wherein a start of the fixed pulse width is given by the further switch changing state and an end of fixed pulse width is given by the resulting voltage of the first capacitor and the at least one switched capacitor reaching the reference voltage.

10. The integrated circuit of claim 6, wherein the FB-DAC is an N-th level current steering FB-DAC, and wherein N corresponds to a number of levels of the I-ADC.

11. The integrated circuit of claim 1, further comprising a feed-forward path connected to the first input node of the I-ADC and to a fourth input node of the I-ADC, the feed-forward path configured to operate in continuous time and to add a signal of the feed-forward path to the output of the CT integrator stage and the output of the DT integrator stage.

12. The integrated circuit of claim 1, wherein the CT integrator stage comprises a single-stage operational transconductance amplifier (OTA).

13. The integrated circuit of claim 1, wherein an effective input impedance, at 1 kHz, of the I-ADC is less than 1 k$\Omega$.

14. The integrated circuit of claim 1, wherein:

a load resistance of the transconductance element or an equivalent impedance, at 1 kHz, of the transconductance element is greater than 1 M$\Omega$;

a transconductance of the transconductance element is greater than $$\frac{1}{400 \text{ kohm}};$$

and a product of the transconductance of the transconductance element and the load resistance of the transconductance element or the equivalent impedance, at 1 kHz, of the transconductance element is greater than 5.

15. The integrated circuit of claim 1, wherein the sensor comprises a capacitive transducer, and wherein the output of the sensor comprises a voltage across first and second mutually charged transducer electrodes.

16. The integrated circuit of claim 15, wherein the capacitive transducer exhibits a capacitance between 0.5 pF and 10 pF.

17. A microphone assembly comprising:

a housing including a base, a cover, and a sound port;

a transducer element disposed in the housing and configured to convert sound into an input voltage signal at a transducer output; and an integrated circuit comprising:

a transconductance element connectable to the transducer output and having a voltage input and a current output, the transconductance element configured to generate a current signal based on the input voltage signal; and a current-input analog-to-digital converter (I-ADC) including a first input node coupled to the current output of the transconductance element and configured to sample and quantize the current signal to generate a corresponding digital sensor signal, wherein the I-ADC comprises:
- a continuous-time (CT) integrator stage and a discrete-time (DT) integrator stage, the CT integrator stage configured to receive the current output of the transconductance element and the I-ADC configured to generate the digital sensor signal based on an output of the CT integrator stage and an output of the DT integrator stage; and
- a feedback digital-to-analog converter (FB-DAC) connecting an output of the I-ADC to a second input node of the I-ADC, the FB-DAC configured to provide a feedback signal based on the digital sensor signal, and the I-ADC configured to add the feedback signal to the current signal at the second input node and to supply a result thereof as an input to the continuous-time (CT) integrator stage.

18. The microphone assembly of claim 17, wherein the I-ADC comprises a current-input sigma-delta modulator (ΣΔ) generating a multi-bit digital sensor signal at a first sampling frequency.

19. The microphone assembly of claim 17, wherein the I-ADC comprises a multi-bit current-input sigma delta (ΣΔ) I-ADC configured to output the digital sensor signal at a resolution comprising at least two bits.

20. The microphone assembly of claim 17, further comprising:
- a feedback path comprising:
  - a digital loop filter configured to receive and filter the digital sensor signal to provide a digital feedback signal;
  - a digital-to-analog converter (DAC) configured to convert the digital feedback signal into an analog feedback signal; and
  - a summing node at the sensor output configured to combine the input voltage signal and the analog feedback signal.

21. The microphone assembly of claim 20, wherein the DAC comprises:
- a hybrid pulse-width and pulse-amplitude modulator (PWAM) configured to generate the analog feedback signal by:
  - converting the digital feedback signal into a corresponding pulse-width and pulse-amplitude modulated signal at a higher sampling frequency than a sampling frequency of the first digital feedback signal.

22. A communication device comprising the microphone assembly of claim 17.

* * * * *